United States Patent [19]

Hata

[11] Patent Number: 5,291,562
[45] Date of Patent: Mar. 1, 1994

[54] IMAGE SIGNAL PROCESSING APPARATUS PRODUCING A NARROWED PULSE WIDTH MODULATED SIGNAL USING AN ASYMMETRICALLY CENTERED TRIANGLE REFERENCE WAVEFORM

[75] Inventor: Yukitsugu Hata, Kanagawa, Japan

[73] Assignee: Fuji Photo Film Co., Ltd., Kanagawa, Japan

[21] Appl. No.: 642,987

[22] Filed: Jan. 18, 1991

[30] Foreign Application Priority Data

Jan. 22, 1990 [JP] Japan ................................ 2-13024
Jan. 22, 1990 [JP] Japan ................................ 2-13025

[51] Int. Cl.$^5$ ...................... H03K 5/153; H03K 5/04; H03K 3/017; G06K 9/64
[52] U.S. Cl. ..................................... 382/41; 358/447; 307/266; 307/358; 328/58; 332/109
[58] Field of Search ................... 382/41; 358/445, 447, 358/299, 298, 296; 346/108, 160; 307/265, 266, 358, 268; 328/58, 110; 332/109

[56] References Cited

U.S. PATENT DOCUMENTS

| | | | |
|---|---|---|---|
| 3,275,853 | 9/1966 | Rothrock | 307/266 |
| 3,489,925 | 1/1970 | Bjerke | 307/265 |
| 3,952,213 | 4/1976 | Fukaya | 307/265 |
| 4,251,821 | 2/1981 | Kimura | 346/108 |
| 4,847,654 | 7/1989 | Honma et al. | 346/160 |
| 4,864,326 | 9/1989 | Kawamura et al. | 346/108 |
| 4,864,419 | 9/1989 | Saito et al. | 358/296 |

FOREIGN PATENT DOCUMENTS 62-118434 5/1987 Japan .

OTHER PUBLICATIONS

"A 32-bit CMOS Microprocessor with On-Chip Cache and TLB", IEEE Journal of Solid-State Circuits, vol. SC-22, No. 5, pp. 800-807.
Introduction to VLSI Systems, pp. 26-29.

*Primary Examiner*—David K. Moore
*Assistant Examiner*—Michael Cammarata
*Attorney, Agent, or Firm*—Sughrue, Mion, Zinn, Macpeak & Seas

[57] ABSTRACT

An image signal processing apparatus including an image signal output device activated in synchronism with a pixel synchronizing signal for outputting therefrom an image signal which defines, as a variable region, a d.c. level formed between a first d.c. level and a second d.c. level exceeding the first d.c. level, a triangle-shaped wave signal generator activated in synchronism with the pixel synchronizing signal for outputting therefrom a triangle-shaped wave signal which defines, as a variable region, a d.c. level formed between a third d.c. level less than the first d.c. level and the second d.c. level, and a comparator supplied with the image signal and the triangle-shaped wave signal so as to output a pulse-width modulated signal therefrom.

9 Claims, 10 Drawing Sheets

IMAGE SIGNAL PROCESSING APPARATUS PRODUCING A NARROWED PULSE WIDTH MODULATED SIGNAL USING AN ASYMMETRICALLY CENTERED TRIANGLE REFERENCE WAVEFORM

BACKGROUND OF THE INVENTION

1. Field of the Invention

The present invention relates to an image signal processing apparatus which is capable of accurately outputting a pulse-width modulated signal in response to an image signal and a triangle-shaped wave signal supplied thereto, and capable of substantially increasing the number of density tones by making the pulse width of the pulse-width modulated signal stable and narrow.

2. Description of the Related Art

As a conventional technique in which an image signal and a triangle-shaped wave signal are inputted therein to output a pulse-width modulated signal, an image signal processing apparatus 2 shown in FIG. 1 can be proposed. FIG. 2 shows waveforms subjected to predetermined processing by the image signal processing apparatus 2. The image signal processing apparatus 2 comprises a comparator 6, an integrator 4 for introducing an integrated signal B as a triangle-shaped wave into one of input terminals of the comparator 6 in synchronism with a pixel synchronizing signal A, and an image signal generator 8 for outputting an image signal C therefrom in synchronism with the pixel synchronizing signal A so as to introduce the image signal C into the other of the input terminals of the comparator 6.

The comparator 6 of the image signal processing apparatus 2 constructed as described above serves to output a pulse-width modulated signal D shown in FIG. 2. As is seen from FIG. 2, the pulse-width modulated signal D has its pulse width proportional to the level of the image signal C.

There is a demand for high speed image signal processing in the field of application of the image signal processing apparatus 2. This demand is intended to enhance the added value, i.e., performance of a system used with the image signal processing apparatus 2 by effecting such high-speed signal processing.

However, when it is desired to process the image signal at high speed in the conventional image signal processing apparatus 2, delays in time with respect to an image signal C such as those shown in FIGS. 3 and 4 appear at the time of a fall and a rise of the image signal C.

As is understood from the same drawings, a problem arises in that pulse widths Pa, Pb, Pc of the pulse-width modulated signal D corresponding to an image signal having the same level III vary according to the levels (I, II, III in the drawings) of the image signal C relative to a pixel immediately before the present pixel.

On the other hand, it is generally necessary to increase the number of density tones corresponding to an area of lightness of an image, that is, to widen the dynamic range of the image density in order to accurately reproduce the density of the image. When a pulse-width modulation system is used, the dynamic range of the image density is determined by the ratio of the maximum pulse width to the minimum pulse width.

It is therefore desirable to set the minimum pulse width as narrow as possible with a view to widening the dynamic range of the image density.

When it is desired to narrow the pulse width of the pulse-width modulated signal D in the conventional image signal processing apparatus 2, it is necessary to make the maximum level of an integrated signal B greater than the maximum level of the image signal C and make smaller the difference (amount of overdrive) between the maximum level of the integrated signal B and the maximum level of the image signal C, as shown in FIG. 5.

However, if the amount of overdrive is made excessively small, the comparator 6 is liable to cause unstable operation, and the pulse width is rendered inconstant. Since there is a limit to the high-speed response characteristics of the integrator 4, a so-called waveform rounding takes place at the tip portion of the integrated signal B as shown in FIG. 6. As a consequence, the amount of narrowing of the minimum pulse width is limited due to the unstable operation of the comparator 6 and the waveform rounding.

SUMMARY OF THE INVENTION

It is a general object of the present invention to provide an image signal processing apparatus which is capable of accurately outputting a pulse-width modulated signal having the same pulse width with respect to an image signal of the same level and capable of accurately outputting a narrow pulse-width modulated signal.

It is another object of the present invention to provide an image signal processing apparatus comprising an image signal output device activated in synchronism with a pixel synchronizing signal for outputting therefrom an image signal which defines, as a variable region, a d.c. level formed between a first d.c. level and a second d.c. level exceeding the first d.c. level, a triangle-shaped wave signal generator activated in synchronism with the pixel synchronizing signal for outputting therefrom a triangle-shaped wave signal which defines, as a variable region, a d.c. level formed between a third d.c. level, which is less than the first d.c. level, and the second d.c. level, and a comparator for receiving the image signal and the triangle-shaped wave signal therein so as to output a pulse-width modulated signal therefrom.

It is a further object of the present invention to provide the apparatus wherein the image signal output device comprises a D/A converter for converting a digital image signal into an analog image signal, and a resistance-type voltage dividing circuit for controlling a reference voltage inputted to the D/A converter or an output voltage delivered from the D/A converter so as to set desired first and second d.c. levels.

It is a still further object of the present invention to provide the apparatus wherein the triangle-shaped wave signal generator comprises a mirror integrator for integrating the pixel synchronizing signal to produce a triangle-shaped wave signal, and a resistance-type voltage dividing circuit for controlling a reference voltage inputted to the mirror integrator so as to set a desired third d.c. level.

It is a still further object of the present invention to provide an image signal processing apparatus comprising a pulse-width modulating circuit for comparing an image signal and a triangle-shaped wave signal to output a pulse-width modulated signal therefrom based on the result of its comparison, a delay circuit for delaying the pulse-width modulated signal for a predetermined period of time, and an AND circuit having one of input terminals to which a pulse-width modulated signal outputted from the pulse-width modulating circuit is inputted, and the other thereof to which a time-delayed pulse-width modulated signal is inputted, the AND circuit being adapted to output a narrow pulse-width modulated signal having the pulse width narrower than that of the pulse-width modulated signal.

It is a still further object of the present invention to provide the apparatus wherein the pulse-width modulating circuit comprises an image signal output device for outputting an image signal therefrom in synchronism with a pixel synchronizing signal, a triangle-shaped wave signal generator for outputting a triangle-shaped wave signal therefrom in synchronism with the pixel synchronizing signal, and a comparator for comparing the image signal and the triangle-shaped wave signal so as to output a pulse-width modulated signal therefrom based on the result of its comparison.

It is a still further object of the present invention to provide the apparatus wherein the delay circuit is comprised of a coaxial cable having a predetermined length corresponding to a delay time.

It is a still further object of the present invention to provide the apparatus wherein the delay circuit is comprised of ECL-IC type buffer elements connected in series to each other by predetermined numbers in association with the delay time.

The above and other objects, features and advantages of the present invention will become apparent from the following description and the appended claims, taken in conjunction with the accompanying drawings in which preferred embodiments of the present invention are shown by way of illustrative example.

DETAILED DESCRIPTION OF THE PREFERRED EMBODIMENTS

Figure 1:
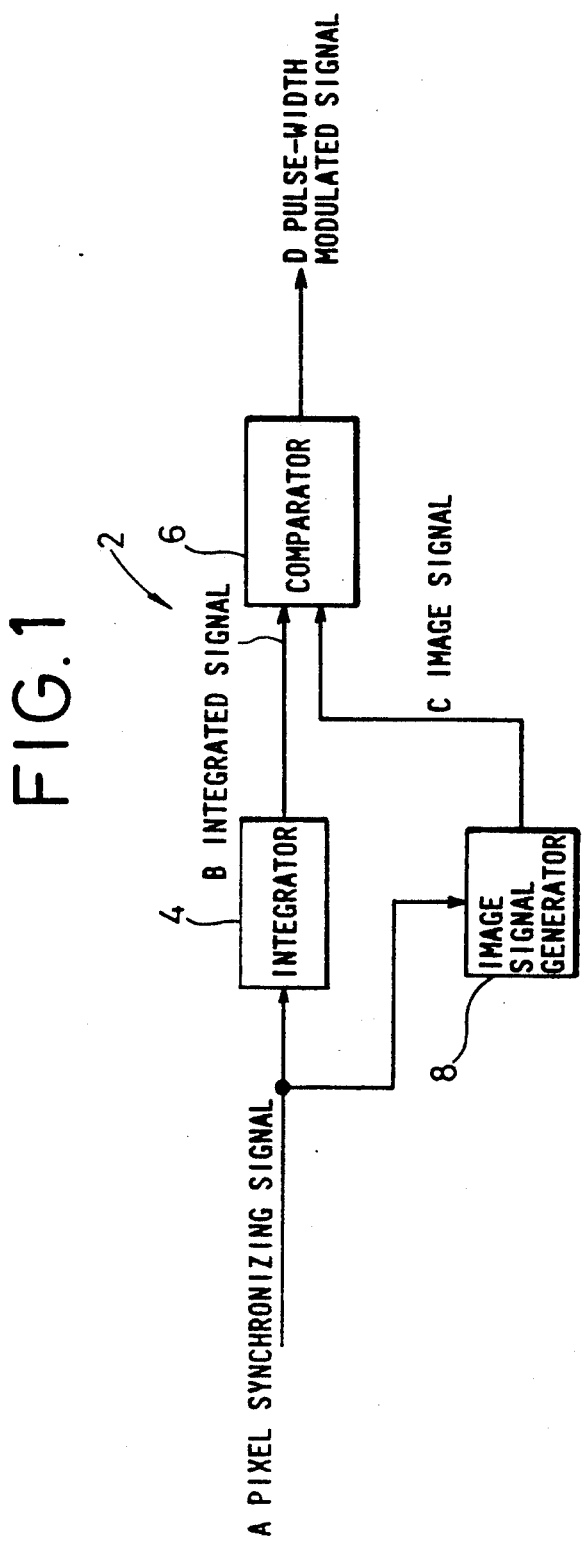
FIG. 1 is a block diagram showing a conventional image signal processing apparatus.
Figure 2:
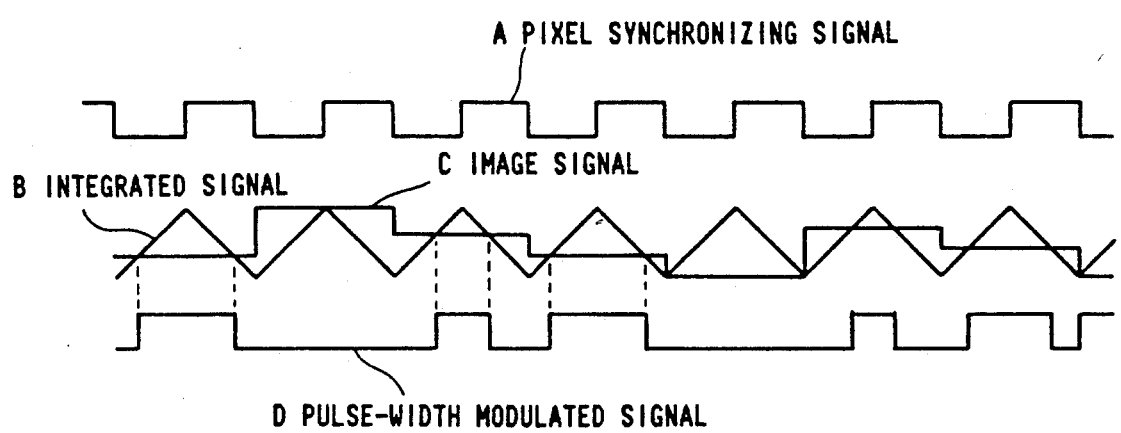
FIGS. 2 through 6 are waveform diagrams for describing the operation of the image signal processing apparatus shown in FIG. 1.
Figure 3:
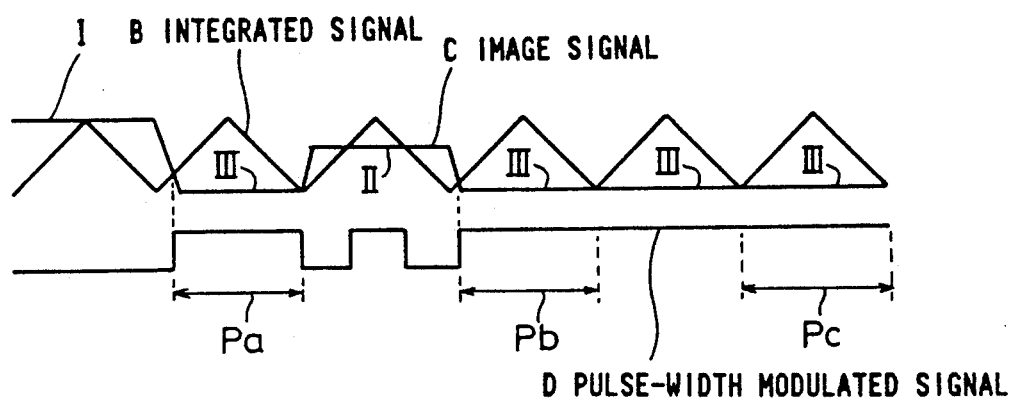
Figure 4:
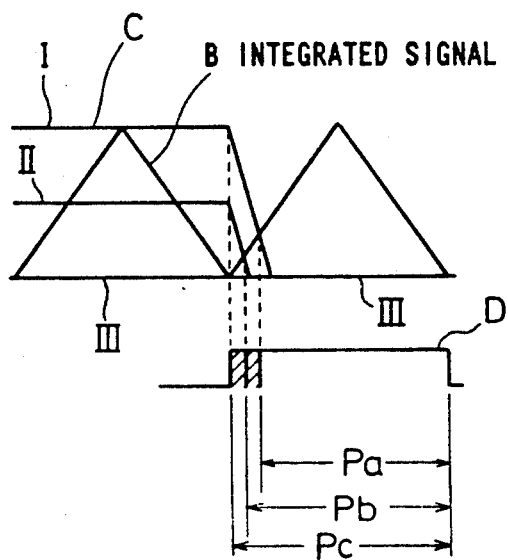
Figure 5:
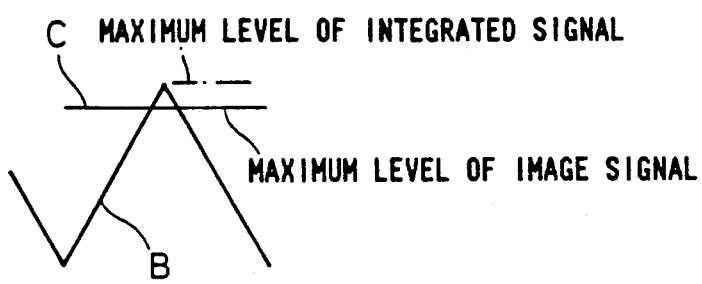
Figure 6:
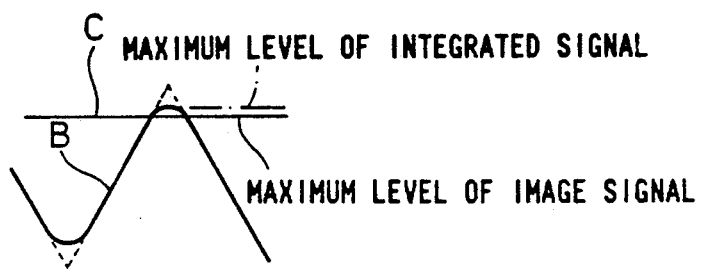
Figure 7:
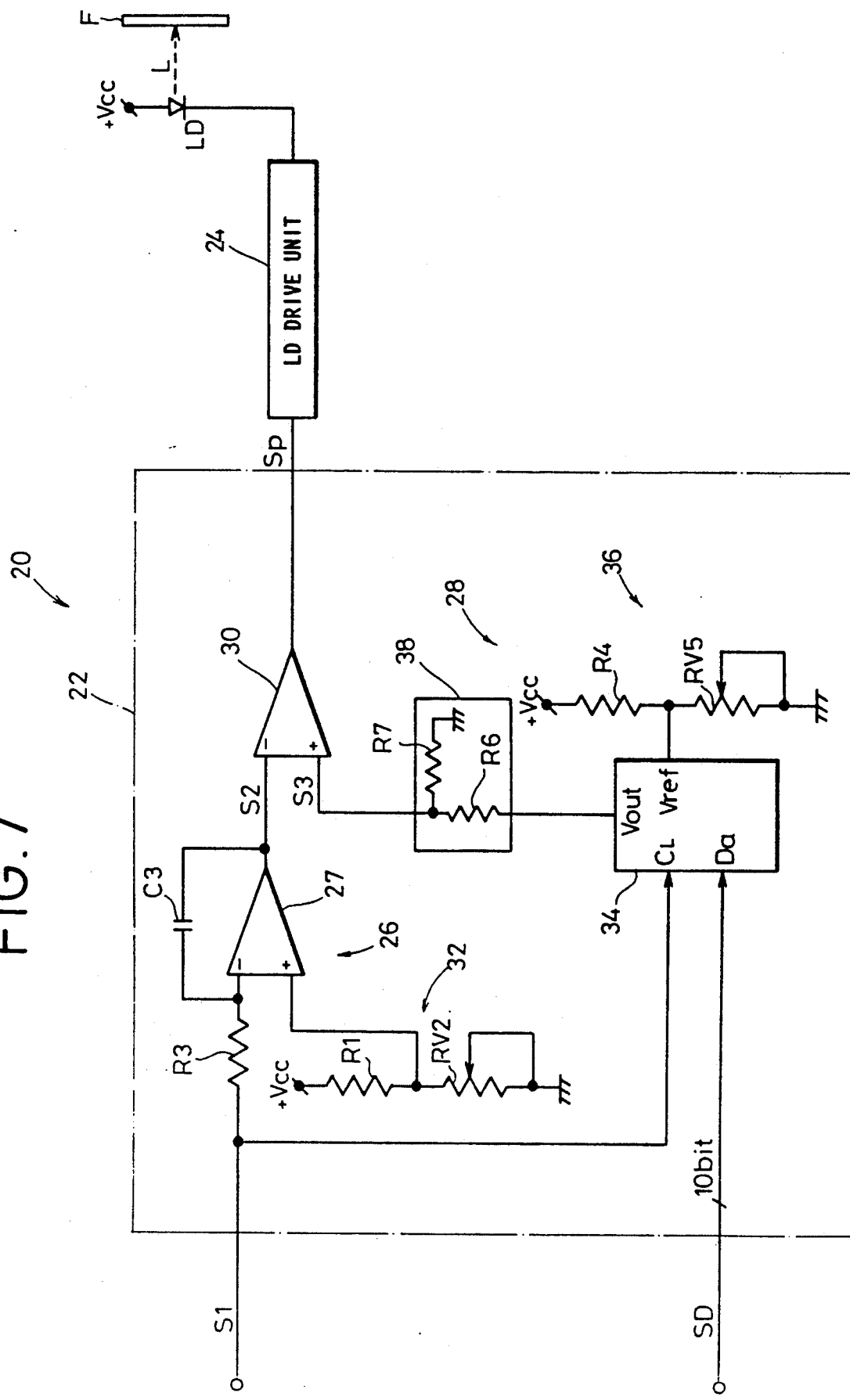
FIG. 7 is a block diagram showing a circuit of an exposure system in which an image signal processing apparatus according to a first embodiment of the present invention is incorporated.

FIG. 7 is a block diagram showing a circuit of an exposure system 20 in which an image signal processing apparatus 22 according to a first embodiment is incorporated.

The exposure system 20 comprises a laser diode LD for subjecting a film F to an emitted light L to produce an image thereby recording the same on the film F, the image signal processing apparatus 22 for outputting a pulse-width modulated signal $S_p$ based on a pixel synchronizing signal $S_1$ and digital image data SD, and a laser diode drive unit 24 (hereinafter called "LD drive unit") responsive to the pulse-width modulated signal $S_p$ supplied thereto so as to subject the laser diode LD to direct modulation.

The image signal processing apparatus 22 comprises a mirror integrator (a triangle-shaped wave signal generator) 26 for outputting a signal $S_2$ of a triangle-shaped periodic wave therefrom in response to the pixel synchronizing signal $S_1$ as a signal of a square-shaped periodic wave supplied thereto, an image signal output device 28 for outputting an image signal $S_3$ therefrom in response to the digital image data SD supplied thereto, and a comparator 30 for receiving the signal $S_2$ and the image signal $S_3$ therein to make a comparison between the two, thereby outputting a pulse-width modulated signal $S_p$ therefrom based on the result of its comparison.

Figure 8:
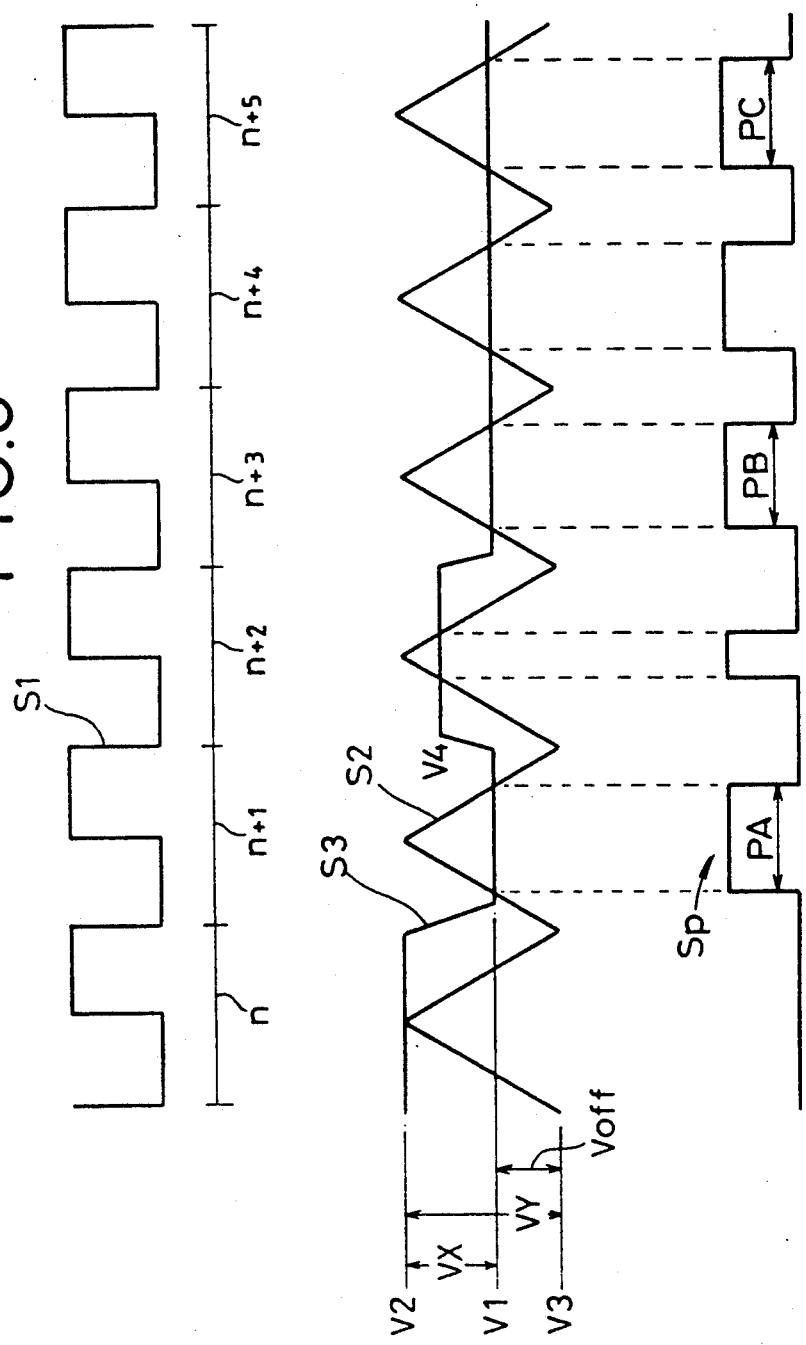
FIGS. 8 and 9 are waveform diagrams for describing the operation of the exposure system shown in FIG. 7.

As shown in FIG. 8, the image signal $S_3$ is one which defines, as a variable region, a d.c. level VX between a first d.c. level $V_1$ and a second d.c. level $V_2$ exceeding the first d.c. level $V_1$. The signal $S_2$ is one which defines, as a variable region, a d.c. level VY between a third d.c. level $V_3$, which is less than the first d.c. level $V_1$, and the second d.c. level $V_2$.

Incidentally, the third d.c. level $V_3$ of the signal $S_2$ can be varied with a variable resistor RV2 in a resistance-type voltage dividing circuit 32 composed of a resistor R1 and the resistor RV2 provided on the input side of an arithmetic amplifier 27 of the mirror integrator 26. The inclination of the signal $S_2$ can be determined by a resistor R3 and a capacitor C3. Incidentally, a description will be made later of determination of the first d.c. level $V_1$ and the second d.c. level $V_2$.

The image signal output device 28 comprises a D/A converter 34, a resistance-type voltage dividing circuit 36 composed of a resistor R4 and a variable resistor RV5 electrically connected to a reference voltage input terminal Vref of the D/A converter 34, and a resistance-type voltage dividing circuit 38 comprised of a resistor R6 and a resistor R7 electrically connected between an output terminal Vout of the D/A converter 34 and an input terminal of the comparator 30. Thus, the first d.c. level $V_1$ and the second d.c. level $V_2$ may be determined by changing the resistance of the resistor RV5 of the resistance-type voltage dividing circuit 36 or changing the resistance values of the resistors R6, R7 of the resistance-type voltage dividing circuit 38. Incidentally, the D/A converter 34 is so constructed that 10-bit digital image data SD is introduced into a data input terminal Da thereof.

The exposure system in which the image signal processing apparatus according to the first embodiment is incorporated is constructed as described above. A description will now be made of the operation of the exposure system.

FIG. 8 is a waveform diagram for describing the operation of the exposure system 20 shown in FIG. 7.

The pixel synchronizing signal $S_1$ as the squarewave signal having a range of from pixel numbers n to n+5 is inputted to the mirror integrator 26 of the image signal processing apparatus 22 and a synchronizing signal input terminal CL of the D/A converter 34 thereof. In this case, the mirror integrator 26 integrates the pixel synchronizing signal $S_1$ so as to produce the triangle-shaped wave signal $S_2$ whose d.c. level is defined as the variable region formed between the third d.c. level $V_3$ and the second d.c. level $V_2$.

On the other hand, the digital image data SD inputted to the D/A converter 34 of the image signal output device 28 is converted through the resistance-type voltage dividing circuit 38 into the image signal $S_3$ whose d.c. level is defined as the variable region formed between the first d.c. level $V_1$ and the second d.c. level $V_2$, in synchronism with the pixel synchronizing signal $S_1$. Incidentally, the d.c. level of the image signal $S_3$ is represented in the form of three levels, i.e., the first d.c. level $V_1$, the second d.c. level $V_2$ and a fourth d.c. level $V_4$ formed between the first d.c. level $V_1$ and the second d.c. level $V_2$ in the present embodiment.

Figure 9:
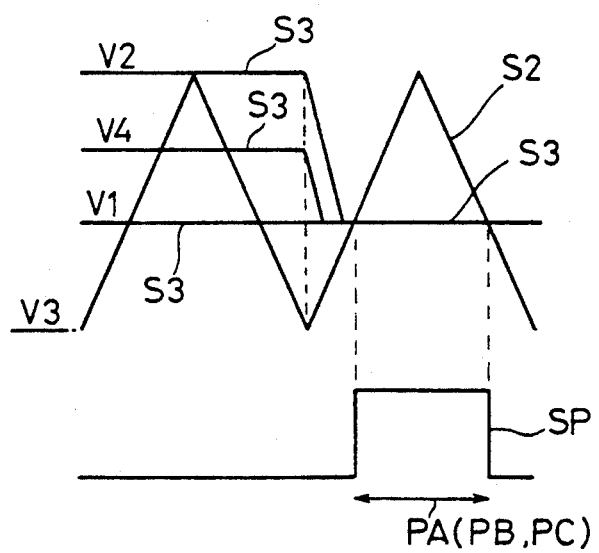

The pulse-width modulated signal $S_p$ shown in FIG. 8 is therefore obtained as an output signal of the comparator 30. As is understood from the same drawing in this case, each waveform of the image signal $S_3$ can be subjected to comparison processing with each signal level after completion of its setting even when a signal time delay is produced upon changing the pixel number n to the pixel number n+1 or upon changing the pixel number n+2 to the pixel number n+3 by providing a so-called offset Voff between the first d.c. level $V_1$ with respect to the image signal $S_3$ and the third d.c. level $V_3$ with respect to the signal $S_2$. Therefore, each of pulse widths PA, PB, PC of the pulse-width modulated signal $S_p$ is rendered consistent accurately with respect to the image signal $S_3$ having the same first d.c. level $V_1$, and hence does not vary in width (see FIG. 9).

The pulse-width modulated signal $S_p$ is inputted to the LD drive unit 24 comprised of a voltage/current converter and then converted into a current signal sufficient to drive the Laser diode LD. Thus, an image corresponding to the digital image data SD is formed on the film F by radiating an emitted light L corresponding to the pulse-width modulated signal $S_p$ on the film F from the laser diode LD while moving the film F in a direction normal to the plane of a sheet.

Figure 10:
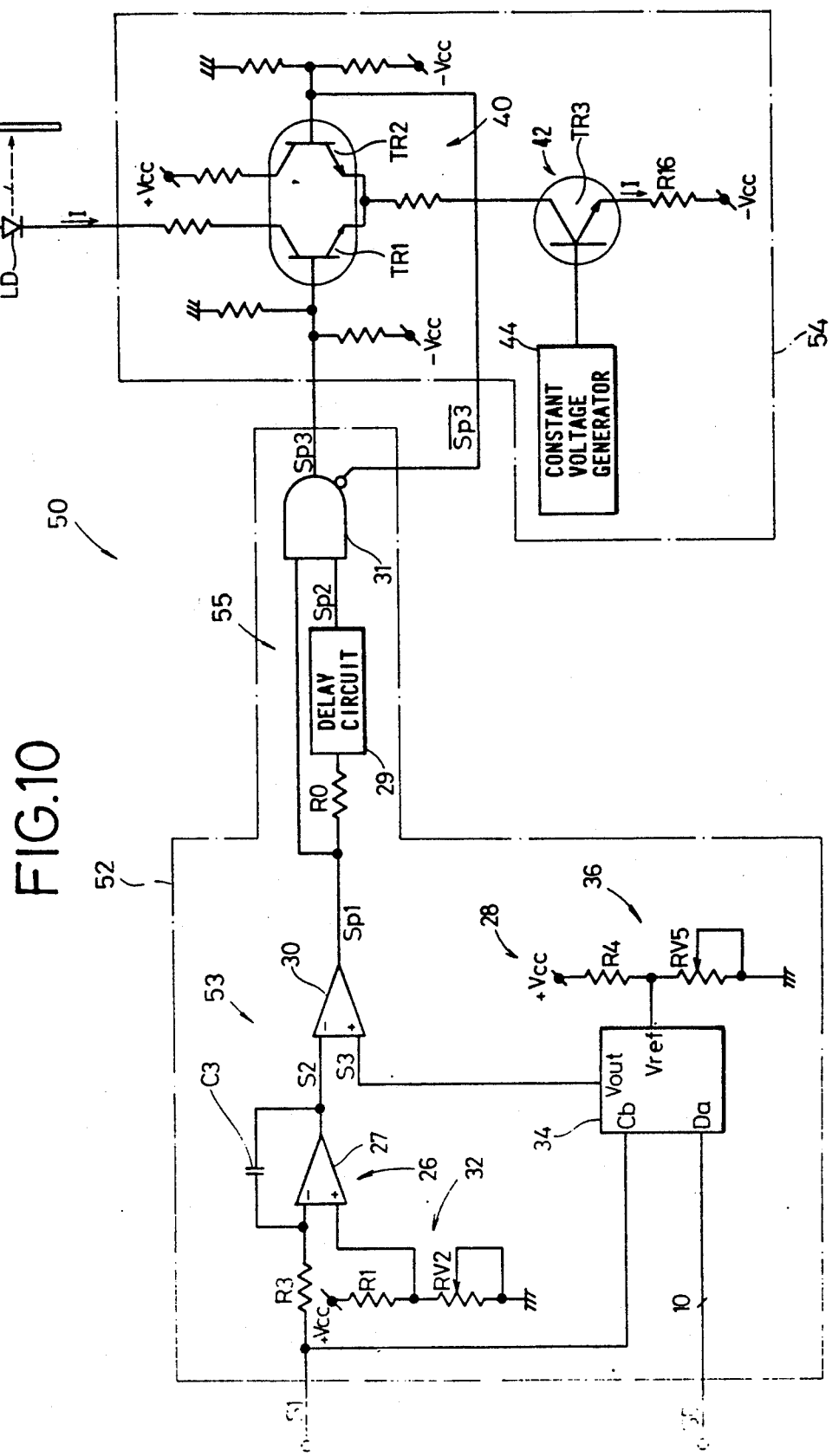
FIG. 10 is a block diagram showing a circuit of an exposure system in which an image signal processing apparatus according to a second embodiment of the present invention is incorporated.

FIG. 10 is a block diagram showing a circuit of an exposure system 50 in which an image signal processing apparatus 52 according to a second embodiment is incorporated. In the same drawing, the same elements of structure as those in the first embodiment shown in FIG. 7 are identified by like reference numerals and their detailed description will therefore be omitted.

The exposure system 50 comprises a laser diode LD for subjecting a film F to an emitted light L to produce an image, thereby recording the same on the film F, an image signal processing apparatus 52 for outputting narrow pulse-width modulated signals $S_{p3}$, $S_{p3}$ based on a pixel synchronizing signal $S_1$ and digital image data SD, and a laser diode drive circuit 54 (hereinafter called "LD drive circuit") for outputting drive current I for subjecting the laser diode LD to direct modulation in response to the narrow pulse-width modulated signal $S_{p3}$ supplied thereto.

The image signal processing apparatus 52 includes a pulse-width modulating circuit 53 responsive to the pixel synchronizing signal $S_1$ and an image signal $S_3$ supplied thereto so as to output a first pulse-width modulated signal $S_{p1}$ therefrom, and a narrow pulse generator 55 responsive to the first pulse-width modulated signal $S_{p1}$ supplied thereto so as to output the narrow pulse-width modulated signals $S_{p3}$, $S_{p3}$ therefrom.

The pulse-width modulating circuit 53 comprises a mirror integrator 26 for outputting a signal $S_2$ of a triangle-shaped periodic wave therefrom in response to the pixel synchronizing signal $S_1$ as a signal of a square-shaped periodic wave supplied thereto, an image signal output device 28 for outputting an image signal $S_3$ therefrom in response to the digital image data SD supplied thereto, and a comparator 30 supplied with the signal $S_2$ and the image signal $S_3$ to make a comparison between the two, thereby outputting a first pulse-width modulated signal $S_{p1}$ therefrom based on the result thus compared.

On the other hand, the narrow pulse generator 55 comprises a delay circuit 29 used to provide a delay time $t_d$, a matching resistor R0, and an AND circuit 31 composed of ECL ICs, for outputting the narrow pulse-width modulated signals $S_{p3}$, $S_{p3}$ response to a second pulse-width modulated signal $S_{p2}$ as an output signal of the delay circuit 29 and the first pulse-width modulated signal $S_{p1}$ as an output signal of the comparator 30 both supplied thereto.

An output terminal Vout of a D/A converter 34 in the image signal output device 28 is electrically connected to an input terminal of the comparator 30.

The LD drive circuit 54 comprises a current switch unit 40 supplied with the narrow pulse-width modulated signals $S_{p3}$, $S_{p3}$ whose polarities differ from each other, and a constant-current unit 42 for determining the value of current I. The current switch unit 40 is basically comprised of a transistor TR1 and a transistor TR2 whose emitters are interconnected. On the other hand, the constant-current unit 42 comprises a constant voltage generator 44, a transistor TR3 and a resistor R16. The current I is determined by a power supply - Vcc, the emitter-base voltage of the transistor TR3 and the resistor R16. As described above, the current I outputted from the LD drive circuit 54 is introduced into the laser diode LD.

The exposure system 50 in which the image signal processing apparatus 52 according to the second embodiment is incorporated is constructed as described above. The operation of the exposure system 50 will now be described.

Figure 11:
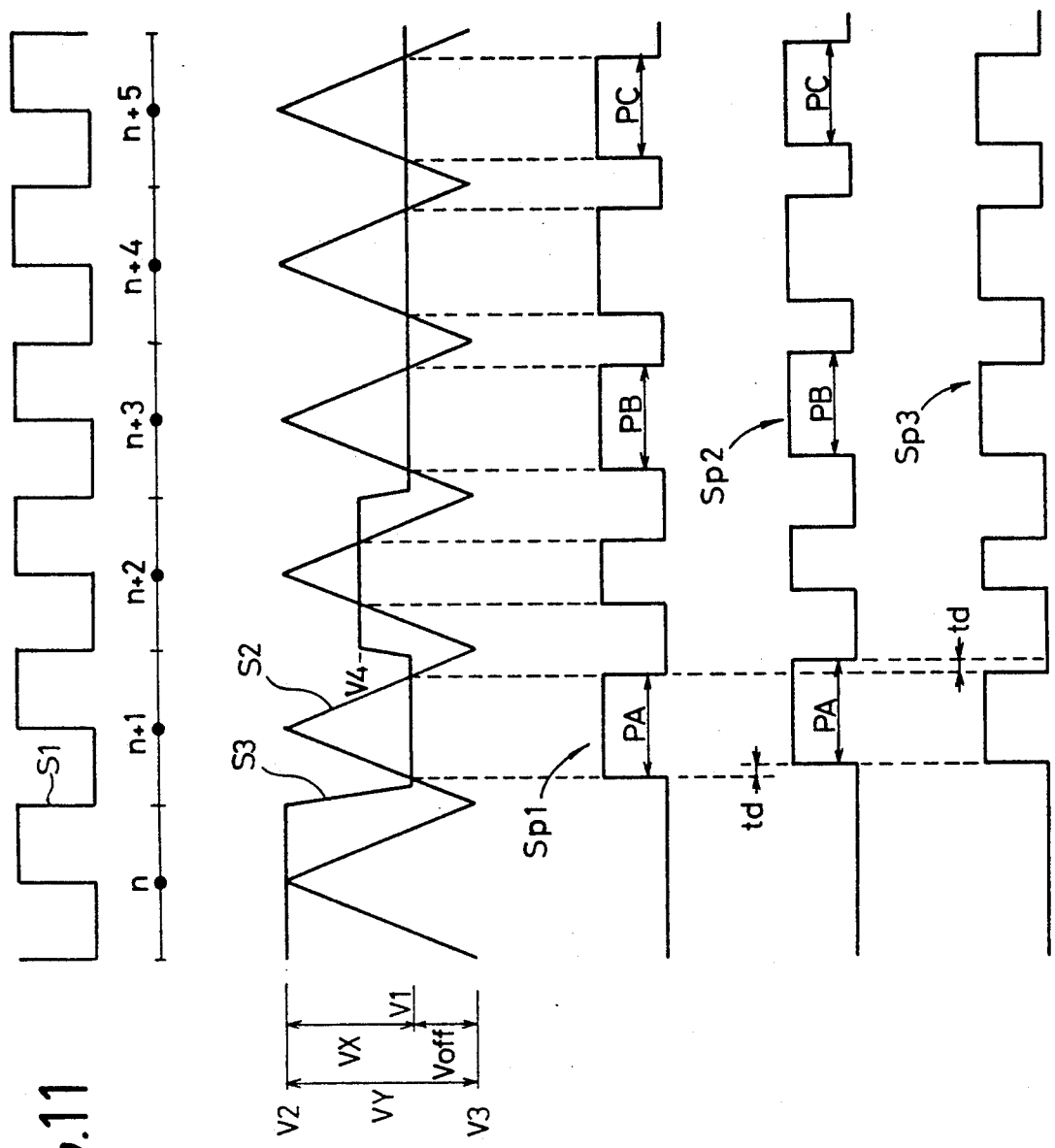
FIG. 11 is a waveform diagram for describing the operation of the exposure system shown in FIG. 10.

FIG. 11 is a waveform diagram for describing the operation of the exposure system 50 shown in FIG. 10.

The pixel synchronizing signal $S_1$ as a squarewave signal having a range of from pixel numbers n to n+5 is inputted to a mirror integrator 26 of the image signal processing apparatus 52 and a synchronizing signal input terminal CL of the D/A converter 34 thereof. In this case, the mirror integrator 26 integrates the pixel synchronizing signal $S_1$ so as to output therefrom a signal $S_2$ of a triangle-shaped wave whose d.c. level is defined as a variable region formed between a third d.c. level $V_3$ and a second d.c. level $V_2$.

On the other hand, the digital image data SD inputted to the D/A converter 34 of the image signal output device 28 is converted into the image signal $S_3$ whose d.c. level is defined as a variable region formed between a first d.c. level $V_1$ and the second d.c. level $V_2$.

The first pulse-width modulated signal $S_{p1}$ shown in FIG. 11 is therefore obtained as an output signal of the comparator 30. Since each waveform of the image signal $S_3$ is subjected to comparison processing with each signal level after completion of its setting in this case, each of pulse widths PA, PB and PC of the first pulse-width modulated signal $S_{p1}$ is rendered consistent accurately with respect to the image signal $S_3$ having the same first d.c. level $V_1$, and hence does not vary in width.

As described above, the first pulse-width modulated signal $S_{p1}$ is introduced into one of input terminals of an AND circuit 31 as it is. In addition, the first pulse-width modulated signal $S_{p1}$ is introduced into the other of the input terminals of the AND circuit 31 through a matching resistor R0 and a delay circuit 29 used to provide a delay time $t_d$. As is seen from FIG. 11, the second pulse-width modulated signal $S_{p2}$ is one delayed by a time interval $t_d$ as compared with the first pulse-width modulated signal $S_{p1}$.

As shown in FIG. 11, the narrow pulse-width modulated signal $S_{p3}$ as an output signal of the AND circuit 31 corresponds to a signal in which only a high-level portion common to the first pulse-width modulated signal $S_{p1}$ and the second pulse-width modulated signal $S_{p2}$ is transmitted. Accordingly, the width of each pulse indicative of the second pulse-width modulated signal $S_{p2}$ is narrowed by the delay time $t_d$ and each of the output signals $S_{p3}$, $\overline{S_{p3}}$ thus narrowed is supplied to the LD drive circuit 54. Incidentally, this narrow pulse-width modulated signal $\overline{S_{p3}}$ is obtained as an inverted signal of the narrow pulse-width modulated signal $S_{p3}$.

In the LD drive circuit 54, the transistors TR1 and TR2 of the current switch unit 40 are brought into an active state and an off state in association with a high level of the narrow pulse-width modulated signal $S_{p3}$ and a low level of the narrow pulse-width modulated signal $S_{p3}$, respectively. On the other hand, the transistor TR1 is brought into an off state in association with a low level of the narrow pulse-width modulated signal $S_{p3}$ and a high level of the narrow pulse-width modulated signal $\overline{S_{p3}}$.

When the transistor TR1 is brought into the active state, the current I for driving the laser diode LD is supplied from the constant-current unit 42. As a consequence, the laser diode LD is subjected to modulation by the narrow pulse-width modulated signal $S_{p3}$. Thus, an image corresponding to the digital image data SD is formed on the film F by radiating the emitted light L corresponding to the narrow pulse-width modulated signal $S_{p3}$ on the film F from the laser diode LD while moving the film F in a direction normal to the plane of a sheet.

According to the second embodiment, if the width of each pulse indicative of the pulse-width modulated signal $S_{p1}$ ranges from 15 nsec. to 190 nsec, and the delay time $t_d$ of the delay circuit 29 is set to 10 nsec., for example, the width of each pulse indicative of the narrow pulse-width modulated signal $S_{p3}$ reaches a range of from 5 nsec. to 180 nsec., and the width of each pulse forming the narrow pulse-width modulated signal $S_{p1}$ becomes narrow. Accordingly, the so-called dynamic range of the image density expressed in the ratio of the maximum pulse width to the minimum pulse width increases to 36 (=180 nsec./5 nsec.) from 12.7 (=190 nsec./15 nsec.), thereby making it possible to increase the dynamic range by about three times.

Incidentally, a coaxial cable of about 2 meters may be employed as the delay circuit 29 in order to obtain the delay time $t_d$ of 10 nsec. Since the coaxial cable has superb high-speed response characteristics, waveform distortion does not appear particularly on the output side of the delay circuit 29. As an alternative to the coaxial cable, ECL-IC type buffer elements may be connected in series as the delay circuit 29 by a predetermined number corresponding to the delay time.

Figure 12:
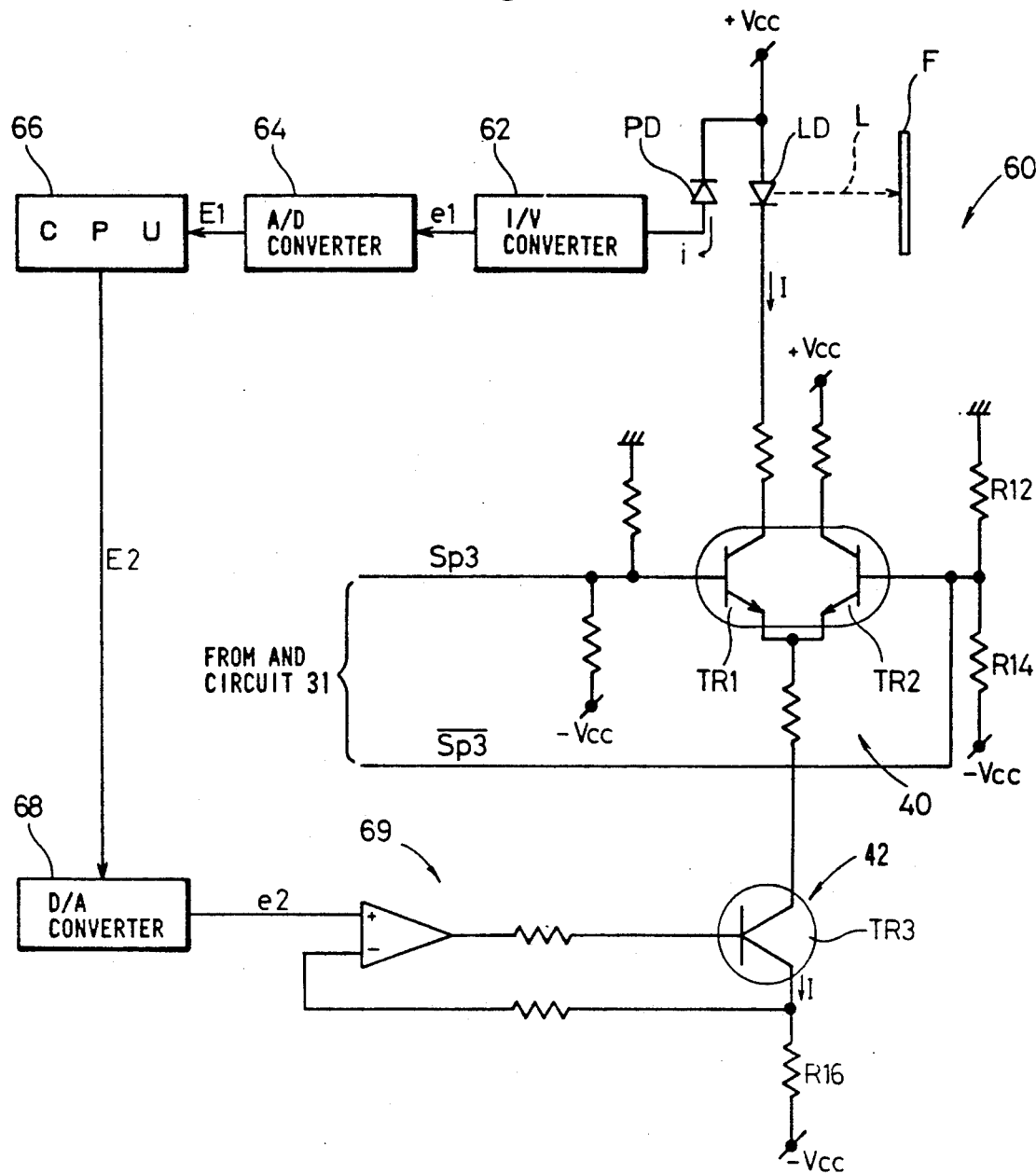
FIG. 12 is a circuit block diagram depicting a modification of a laser diode drive circuit in the exposure system illustrated in FIG. 10.

In order to keep constant the intensity of the emitted light L outputted from the laser diode LD, the narrow pulse-width modulated signals $S_{p3}$, $\overline{S_{p3}}$ outputted from the AND circuit 31 of the narrow pulse generator 55 may be supplied to the LD drive circuit 50 provided with an APC (Automatic Power Control) circuit shown in FIG. 12.

Incidentally, as is seen from FIG. 12, the APC circuit comprises a photodiode PD for monitoring the intensity of the light L emitted from the laser diode LD, an I/V converter 62 for converting output current i of the photodiode PD into a voltage signal e1, an A/D converter 64 for converting the voltage signal e1 into a digital voltage signal E1, a CPU 66 as a one-chip type microprocessor including a look-up table of data about the relationship of correspondence between the digital voltage signal E1 and the current I for driving the laser diode LD, said data being predetermined and stored in the CPU 66, a D/A converter 68 for converting a digital voltage signal E2 outputted from the CPU 66 into an analog voltage signal e2 based on the data on the relationship of correspondence, and a buffer 69 for reducing an output impedance at the analog voltage signal e2 and defining, as 1, the gain introduced into a base terminal of the transistor TR3 of the constant-current unit 42.

According to the present invention, as has been described, the image signal processing apparatus comprises the image signal output device activated in synchronism with the pixel synchronizing signal for thereby outputting the image signal therefrom which defines, as the variable region, the d.c. level formed between the first d.c. level and the second d.c. level exceeding the first d.c. level, the triangle-shaped wave signal generator operated in synchronism with the pixel synchronizing signal so as to output the triangle-shaped wave signal therefrom which defines, as the variable region, the d.c. level formed between the third d.c. level less than the first d.c. level and the second d.c. level, and the comparator supplied with the image signal and the triangle-shaped wave signal so as to output the pulse-width modulated signal therefrom.

Therefore, the third d.c. level as the lower limit of the triangle-shaped wave signal can be rendered lower than the first d.c. level as the lower limit of the image signal. As a consequence, a pulse-width modulated signal having an accurate pulse width can be obtained without any influence on the pulse width of the pulse-width modulated signal corresponding to the image signal having a predetermined level by the level of the image signal immediately before the present image signal.

According further to the present invention, the pulse-width modulated signal can be converted into the narrow pulse-width modulated signal by making use of the delay circuit and the AND circuit.

Since circuits having relatively high-speed response characteristics and a wide range of frequencies can be employed in the delay circuit and the AND circuit, the so-called waveform rounding does not appear in the narrow pulse-width modulated signal. It is therefore possible to increase the number of density tones corresponding to the area of lightness of an image. As a consequence, a so-called image signal processing apparatus having a broad dynamic range of image density can be obtained.

Having now fully described the invention, it will be apparent to those skilled in the art that many changes and modifications can be made without departing from the spirit or scope of the invention as set forth herein.

What is claimed is:

1. An image signal processing apparatus comprising:
   an image signal output device activated in synchronism with a pixel synchronizing signal for outputting therefrom an image signal which varies between a first d.c. level and a second d.c. level exceeding said first d.c. level;

a triangle-shaped wave signal generator activated in synchronism with said pixel synchronizing signal for outputting therefrom a triangle-shaped wave signal which varies between a third d.c. level, which is less than said first d.c. level, and said second d.c. level, such that said image signal varies asymmetrically with respect to a baseline of said triangle-shaped wave signal; and a comparator for receiving said image signal and said triangle-shaped wave signal therein so as to output a pulse-width modulated signal therefrom.

2. An image signal processing apparatus according to claim 1, wherein said image signal output device comprises a D/A converter for converting a digital image signal into an analog image signal, and a resistance-type voltage dividing circuit for controlling a reference voltage inputted to said D/A converter or an output voltage delivered from said D/A converter so as to set desired first and second d.c. levels.

3. An image signal processing apparatus according to claim 1, wherein said triangle-shaped wave signal generator comprises a mirror integrator for integrating said pixel synchronizing signal to produce a triangle-shaped wave signal therefrom, and a resistance-type voltage dividing circuit for controlling a reference voltage inputted to said mirror integrator so as to set a desired third d.c. level.

4. An image signal processing apparatus comprising:

a pulse-width modulating circuit for comparing an image signal and a triangle-shaped wave signal to output a pulse-width modulated signal therefrom based on the result of its comparison, said image signal varying between a first d.c. level and a second d.c. level exceeding said first d.c. level, said triangle-shaped wave signal varying between a third d.c. level, which is less than said first d.c. level, and said second d.c. level;

a delay circuit for delaying said pulse-width modulated signal for a predetermined period of time; and an AND circuit having a first input terminal to which a pulse-width modulated signal outputted from said pulse-width modulating circuit is inputted, and a second input terminal, such that said image signal varies asymmetrically with respect to a baseline of said triangle-shaped wave signal to which a time-delayed pulse-width modulated signal outputted from said delay circuit is inputted, said AND circuit being adapted to output a narrow pulse-width modulated signal having the pulse width narrower than that of said pulse-width modulated signal, wherein said pulse-width modulating circuit comprises an image signal output device for outputting an image signal therefrom in synchronism with a pixel synchronizing signal, a triangle-shaped wave signal generator for outputting a triangle-shaped wave signal therefrom in synchronism with said pixel synchronizing signal, and a comparator for comparing said image signal and said triangle-shaped wave signal so as to output a pulse-width modulated signal therefrom based on the result of its comparison.

5. An image signal processing apparatus according to claim 4, wherein said delay circuit is comprised of a coaxial cable having a predetermined length corresponding to a delay time.

6. An image signal processing apparatus according to claim 4, wherein said delay circuit is comprised of ECL-IC type buffer elements connected in series to each other by predetermined numbers in association with the delay time.

7. An apparatus for producing pulse-width modulated signals from digital image data and a synchronizing signal, said apparatus comprising:

triangular-shaped wave signal generator means for receiving the synchronizing signal and for producing a triangular-shaped wave signal having a voltage level which varies between an upper voltage level and a lower voltage level;

image signal generator means for receiving the synchronizing signal and the digital image data and for producing an analog image signal having a voltage level which varies between the upper voltage level of said triangular-shaped wave signal and an intermediate voltage level, the intermediate voltage level being between the upper voltage level and the lower voltage level, and the intermediate level being offset from the lower voltage level by an offset amount, wherein said image signal varies asymmetrically with respect to a baseline of said triangular-shaped wave signal; and comparison means for comparing the analog image signal and the triangular-shaped wave signal to produce the pulse-width modulated signals.

8. An apparatus according to claim 7, wherein said apparatus further comprises narrow pulse generator means for receiving the pulse-width modulated signals and for producing a narrow pulse-width modulated signal.

9. An apparatus according to claim 8, wherein said narrow pulse generator means comprises:

delay means for delaying the pulse-width modulated signals by a predetermined amount to produce delayed signals; and arithmetic means for producing the narrow pulse-width modulated signal in accordance with the pulse-width modulated signals and the delayed signals.

* * * * *